(12) United States Patent
Ward et al.

(10) Patent No.: US 11,929,670 B1
(45) Date of Patent: Mar. 12, 2024

(54) MODULAR CONFIGURABLE ELECTRONIC POWER CONVERSION

(71) Applicants: Steven R Ward, Fort Collins, CO (US); Jan Walter Schroeder, Sotern (DE); Joseph W Pawelski, Fort Collins, CO (US); Toby Joseph Daniel Mould, South Croydon (GB)

(72) Inventors: Steven R Ward, Fort Collins, CO (US); Jan Walter Schroeder, Sotern (DE); Joseph W Pawelski, Fort Collins, CO (US); Toby Joseph Daniel Mould, South Croydon (GB)

(73) Assignee: CisLunar Industries USA, Inc., Loveland, CO (US)

( * ) Notice: Subject to any disclaimer, the term of this patent is extended or adjusted under 35 U.S.C. 154(b) by 0 days.

(21) Appl. No.: 18/230,126

(22) Filed: Aug. 3, 2023

Related U.S. Application Data

(63) Continuation of application No. 18/220,648, filed on Jul. 11, 2023.

(51) Int. Cl.
  *H02M 3/00* (2006.01)
  *B64G 1/42* (2006.01)
  *H05K 7/14* (2006.01)

(52) U.S. Cl.
  CPC .......... *H02M 3/003* (2021.05); *H05K 7/1428* (2013.01); *B64G 1/428* (2013.01)

(58) Field of Classification Search
  CPC ...... H02M 3/003; H05K 7/1428; B64G 1/428
  See application file for complete search history.

(56) References Cited

U.S. PATENT DOCUMENTS

| | | | | |
|---|---|---|---|---|
| 5,768,117 | A * | 6/1998 | Takahashi | H02J 1/102 363/78 |
| 7,555,665 | B2 * | 6/2009 | Belson | G06F 1/30 713/340 |
| 2023/0170793 | A1 * | 6/2023 | Chen | H02M 1/0067 363/13 |

* cited by examiner

*Primary Examiner* — Carlos Amaya
(74) *Attorney, Agent, or Firm* — Outer Space IP

(57) ABSTRACT

Systems, methods, and devices for converting electric power are disclosed. Converter modules convert power in a configurable manner in conjunction with a controller.

20 Claims, 10 Drawing Sheets

MODULAR CONFIGURABLE ELECTRONIC POWER CONVERSION

CROSS-REFERENCE TO RELATED APPLICATIONS

The present application claims priority to U.S. patent application Ser. No. 18/220,648.

TECHNICAL FIELD

The present disclosure relates generally to electrical infrastructure. More specifically, the present disclosure relates to power conversion.

BACKGROUND

Power conversion on earth and in space require systems to receive and convert the power. Improved methods and systems for power conversion are required, especially in the space sector.

SUMMARY

In a first aspect, the disclosure provides a system to convert electric power. One or more converter modules are configured to bidirectionally convert voltage from a power input and transmit converted voltage to a power output. A power bus is configured to connect the power input, the one or more converter modules, and the power output. A controller module is configured to receive feedback including voltages, currents, frequencies, faults, or combinations thereof from the one or more converter modules. The controller module is further configured to provide instructions to the one or more converter modules to vary the converted voltage, vary current transmitted, reroute power through a different converter module or converter modules of the one or more converter modules, or combinations thereof.

In a second aspect, the disclosure provides a method for converting electric power. Power is provided to a power input and through one or more converter modules to bidirectionally convert voltage. Converted voltage is transmitted from the one or more converter modules to a power output. Feedback is sent from the one or more converter modules to a controller module, feedback including voltages, currents, frequencies, faults, or combinations thereof. Instructions are provided to the one or more converter module to vary the converted voltage, vary current transmitted, reroute the power through a different converter module or converter modules of the one or more converter modules, or combinations thereof.

In a third aspect, the disclosure provides a device for converting electric power. A power bus is connected to a power input, a power output, and one or more converter modules. Power is passed through the power input to the power bus and to the one or more converter modules. The one or more converter modules bidirectionally convert voltage and supply converted voltage to the power output. A controller module receives feedback from the one or more converter modules and provides instructions to the one or more converter modules to vary the converted voltage, vary current transmitted, reroute the power through a different converter module or converter modules of the one or more converter modules, or combinations thereof. The feedback includes voltages, currents, frequencies, faults, or combinations thereof.

Further aspects and embodiments are provided in the foregoing drawings, detailed description and claims.

BRIEF DESCRIPTION OF THE DRAWINGS

The following drawings are provided to illustrate certain embodiments described herein. The drawings are merely illustrative and are not intended to limit the scope of claimed inventions and are not intended to show every potential feature or embodiment of the claimed inventions. The drawings are not necessarily drawn to scale; in some instances, certain elements of the drawing may be enlarged with respect to other elements of the drawing for purposes of illustration.

DETAILED DESCRIPTION

Figure 1:
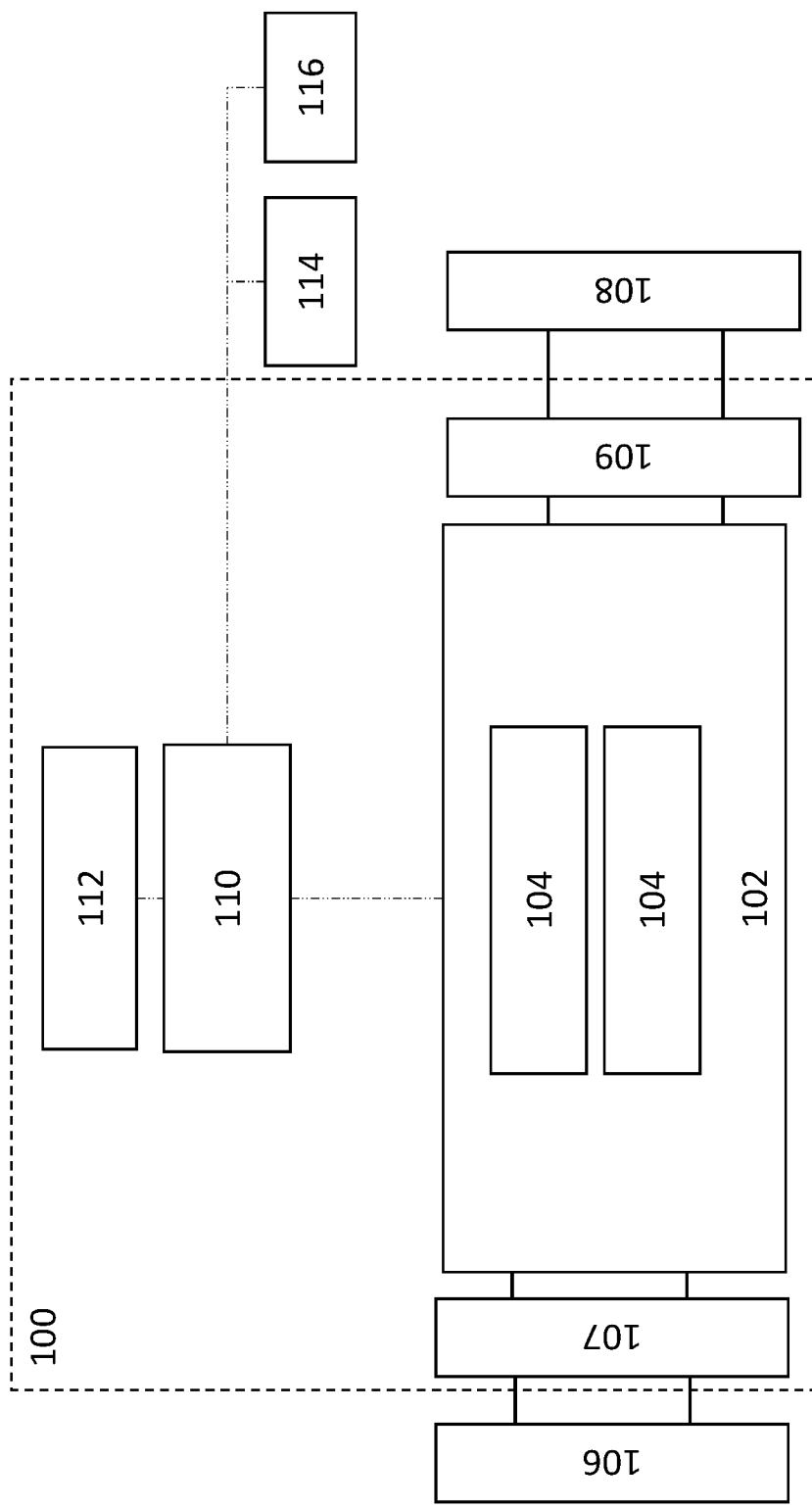
FIG. 1 is a circuit diagram showing a system for converting electric power.

The following description recites various aspects and embodiments of the inventions disclosed herein. No particular embodiment is intended to define the scope of the invention. Rather, the embodiments provide non-limiting examples of various compositions, and methods that are included within the scope of the claimed inventions. The description is to be read from the perspective of one of ordinary skill in the art. Therefore, information that is well known to the ordinarily skilled artisan is not necessarily included.

Definitions

The following terms and phrases have the meanings indicated below, unless otherwise provided herein. This disclosure may employ other terms and phrases not expressly defined herein. Such other terms and phrases shall have the meanings that they would possess within the context of this disclosure to those of ordinary skill in the art. In some instances, a term or phrase may be defined in the singular or plural. In such instances, it is understood that any term in the singular may include its plural counterpart and vice versa, unless expressly indicated to the contrary.

As used herein, the singular forms "a," "an," and "the" include plural referents unless the context clearly dictates otherwise. For example, reference to "a substituent" encompasses a single substituent as well as two or more substituents, and the like.

As used herein, "for example," "for instance," "such as," or "including" are meant to introduce examples that further clarify more general subject matter. Unless otherwise expressly indicated, such examples are provided only as an aid for understanding embodiments illustrated in the present disclosure and are not meant to be limiting in any fashion. Nor do these phrases indicate any kind of preference for the disclosed embodiment.

As used herein, "module" is meant to refer to a functional block in the system or method and is removable, replaceable, and does a specific function or functions.

As used herein, an "converter module" is meant to refer to a module that contains at least a voltage bridge, multiple voltage bridges, or one or more voltage bridges and a voltage booster, such as a transformer.

As used herein, an "LLC" module is meant to refer to an inductor-inductor-capacitor circuit.

In order to support In-Space, Lunar, and Mars-based electrical infrastructure necessary to power, logistics, research, permanent habitation, and safe day-to-day operations, the present invention is disclosed. This modular configurable electronic power converter (MCEPC) is usable terrestrially, in orbit, or on moons and planets. The MCEPC disclosed is small, efficient, networked, and modular. The MCEPC is more resilient to the environment, smaller in size and weight, easier to maintain and repair, and produced at an overall lower manufacturing, shipping, and installation cost, versus previous power conversion systems, devices, and methods.

MCEPC is built from one or more converter modules connected in series and/or parallel arrays (low voltage bridges in parallel, high voltage bridges in series) to safely and consistently meet flexible voltage and power demands of a developing power grid. The commonality of the converter module offers benefits in terms of production costs and system scalability. The use of multiple converter modules to constitute an MCEPC offers options for redundancy and resiliency in the event of an converter module failure, as well as reducing the cost for repair.

In some embodiments, the complete bidirectional, isolating MCEPC has components such as transformers, connectors, filters, circuit breakers, disconnects and thermal management. These components are typically much more than half of the total size and weight of a typical converter and are largely immune to radiation effects. The modular approach allows these more reliable components of the converter to be kept "in service" while the converter modules or components of converter modules, which degrade more quickly, can be replaced. Consequently, the converter modules are designed to minimize size and weight to reduce transportation cost and be easy to replace.

In some embodiments, a Dual Active Bridge (DAB) converter architecture is used which has two common forms. The resonant transformer approach allows optimization for energy efficiency when the input and output voltages are relatively "fixed" in their ratio. Conversely, a non-resonant transformer design allows for a wide range input as would be expected with battery or solar energy sources. Both converter types can be realized using the very same converter modules and MCEPC structure by changing the transformer design and control algorithm. A hybrid approach is applied in one embodiment to the total MCEPC unit utilizing a combination of fixed-voltage and variable-voltage cells. The hybrid approach enables as much voltage regulation flexibility and system redundancy as needed and leaves the bulk of the power conversion work to the efficiency-optimized fixed-voltage cells. The converter modules have enough intelligence to manage their high-speed feedback control necessary for power conversion as well as communicate with each other through a controller to coordinate their operations. The onboard network interface allows communication to a greater grid control system in order to direct the flow of energy as needed.

The MCEPC mechanical design is crucial to realizing its benefit of being serviceable. In some embodiments, the parts most likely to need replacement are easily accessible while also accomplishing the tasks of electrical and thermal connection in a potentially dusty, radiation exposed, vacuum environment.

In some embodiments, the converter module consists of a microprocessor, field programmable gate arrays (FPGAs), or ASIC "brain" and the power semiconductor switches, typically in a dual-active-bridge configuration. The transformer and input/output filters, isolating disconnects would be separate from the bridges as their expected useful lifetime would exceed the semiconductors and they have significant size, weight and replacement/transportation costs. The bridges are designed to plug into a converter housing which dictates the number of bridges and the power and voltage rating of the converter overall. Using a common bridge and converter module design offers reduced design and qualification costs to support many different conversion needs.

In one embodiment, a complete MCEPC consists of a stack of low-voltage converters to reach high-voltage and high-power capability. The low-voltage ports of the converters would be parallel-connected to supply 100V bus while the high-voltage ports would be series-connected to reach 1-3 kV for transmission needs. This offers redundancy within the converter. For instance, a 100V-3000V converter may require six 500V-rated converters in series to reach 3000V and the rated power, but for reliability reasons could use eight converter modules. This system would allow up to two converter module failures while still maintaining functionality with 6 working converter modules remaining.

In some embodiments, the MCEPC system has controls at multiple levels. The converter modules have a local controller which manages the high-speed feedback control necessary for the DC-DC power conversion. These local controllers relay telemetry data to a higher-level network controller which would interface to the greater grid control network.

Power semiconductors are significant to the realization of MCEPC. Radiation-hardened Silicon MOSFETs have significant performance penalties compared to Silicon-Carbide (SiC) and Gallium Nitride (GaN) counterparts used terrestrially.

In one embodiment, GaN HEMTs (high electron-mobility transistors) are targeted for the low and/or the high voltage bridges Compared to silicon devices this allows for a great reduction in the power dissipation. Furthermore, their small size allows for smaller converter designs, or allows for greater number of parallel devices or devices in series which reduces power dissipation further which helps enable a modular approach with reduced thermal management costs.

In one embodiment, SiC MOSFETs are used for the high-voltage and/or the low voltage bridge. This minimizes component count to realize higher operating voltages. SiC devices do not have the natural robustness of GaN devices, and might fail from single-event burnout (SEB) at voltages much lower than their rated voltage.

The input-output voltage, and power capability of the converter modules herein are well suited for electric thruster/propulsion power.

The proposed converter architecture provides the flexibility for input or output voltage as well as controllable energy transfer making it ideal for charging and discharging of battery energy storage systems where the battery voltage can vary by as much as 25%. On a similar note, the voltage flexibility provides support for Photovoltaic installations where the DC bus voltage may fluctuate based on long term degradation of the solar cells. The converter may also provide Maximum Power Point Tracking capability depending on the architecture of the PV array and how it interfaces to the MCEPC.

The present innovation most directly allows for low-levels of user interaction with the power conversion process. The systems, methods, and devices disclosed herein maintain balanced loads with individual converter module failures and therefore keep power flowing during the time that operators may be unavailable for maintenance.

Now referring to FIG. 1, FIG. 1 is a circuit diagram showing a system for converting electric power that may be used in one embodiment of the present invention. A modular configurable electric power converter (MCEPC) 100 consists of a power bus 102 with converter modules 104, input filters and disconnects 107, and output filters and disconnects 109. The MCEPC 100 further consists of a communication bus 110, with a controller module 112. Auxiliary circuits 114, instrumentation components 116, and the controller module 112 all attach to the communication bus 110. The communication bus 110 also attaches to the converter modules 104.

The main power input 106 connects to the filters and disconnects 107. The filters and disconnects 109 connect to the power output 108. The power bus 102 is sandwiched by the filters and disconnects 107 and 109. The converter modules 104 are attached to the power bus 102. The converter modules 104 are configured to bidirectionally convert voltage from the power input 106 and transmit the converted voltage to the power output 108. In this embodiment, the converter modules 104 are configured with their low-voltage ports in parallel and their high-voltage ports in series configuration for high voltage boosting. In some embodiments, the converter modules 104 are configured with the low voltage ports in parallel and the high voltage ports in parallel to realize high current transmission.

The controller module 112 is configured to receive feedback including voltages, currents, frequencies, faults, or combinations thereof from the converter modules 104. The controller module 112 is further configured to provide instructions to the converter modules 104 to vary the converted voltage, vary the current transmitted, reroute the power through a different combination of the converter modules 104, or combinations thereof.

In some embodiments, an converter module fails and the controller 112 receives feedback (or a lack of feedback) from the failed converter module and reroutes the power through operational converter modules.

Figure 2:
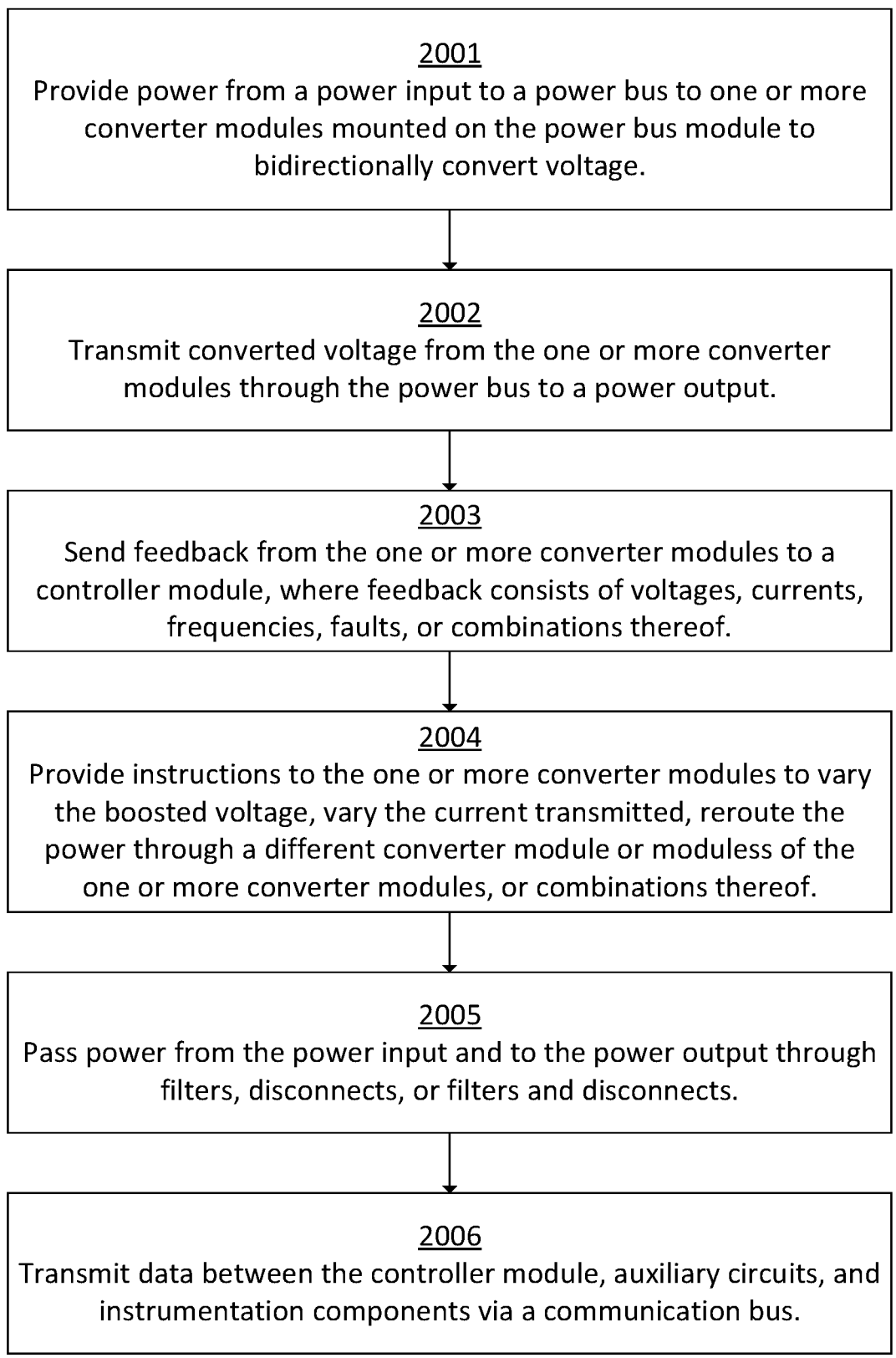
FIG. 2 is a block flow diagram showing a method for converting electric power.

Now referring to FIG. 2, FIG. 2 is a block flow diagram showing a method for converting electric power that may be used in one embodiment of the present invention. At 2001, power from a power input is provided to a power bus and to one or more converter modules mounted on the power bus module to bidirectionally convert voltage. At 2002, the converted voltage is transmitted from the one or more converter modules through the power bus to a power output. At 2003, feedback is sent from the one or more converter modules to a controller module. Feedback consists of voltages, currents, frequencies, faults, or combinations thereof. At 2004, instructions are provided to the one or more converter modules to vary the converted voltage, vary the current transmitted, reroute the power through a different converter module or converter modules of the one or more converter modules, or combinations thereof. At 2005, power is passed from the power input and to the power output through filters, disconnects, or filters and disconnects. At 2006, data is transmitted between the controller module, auxiliary circuits, and instrumentation components via a communication bus.

Figure 3A:
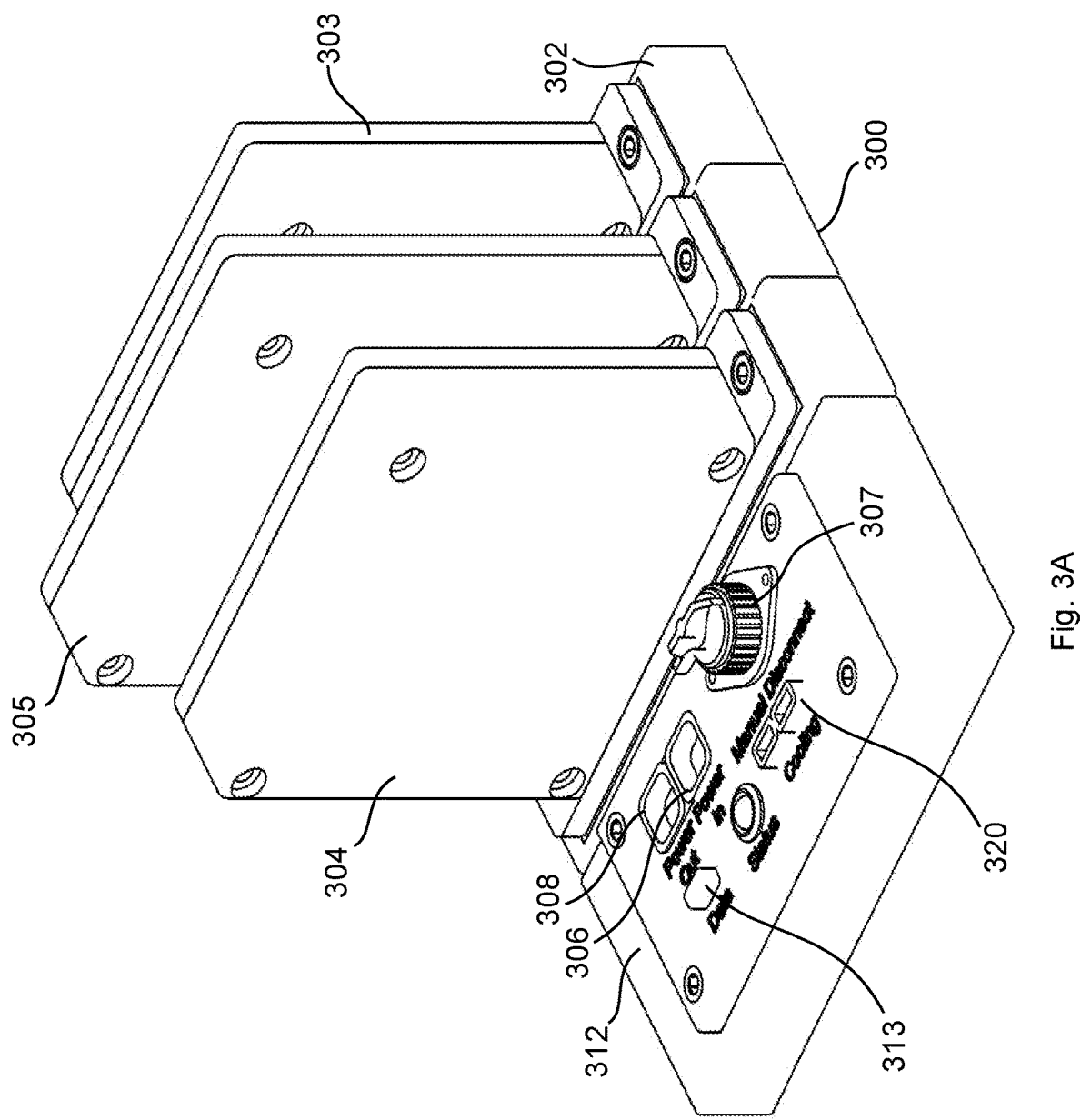
FIG. 3A is an isometric view of a device for converting electric power.
Figure 3B:
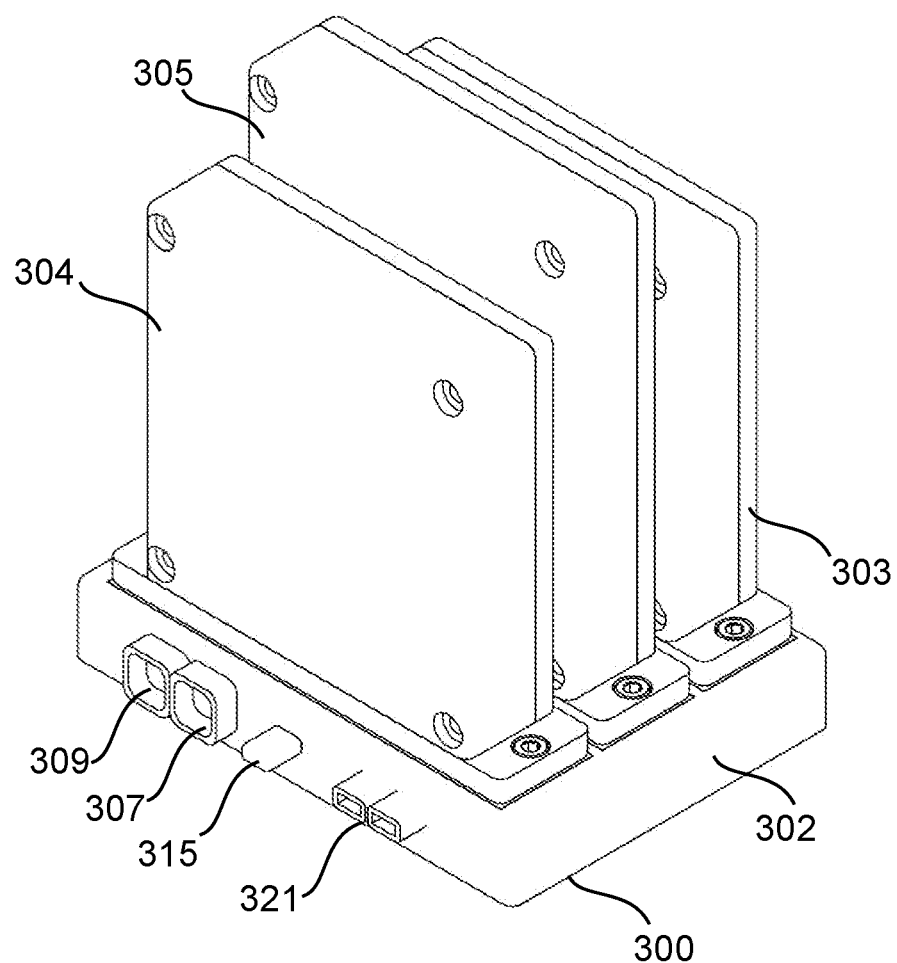
FIG. 3B is an isometric view of a modular attachment unit of FIG. 3A.
Figure 3C:
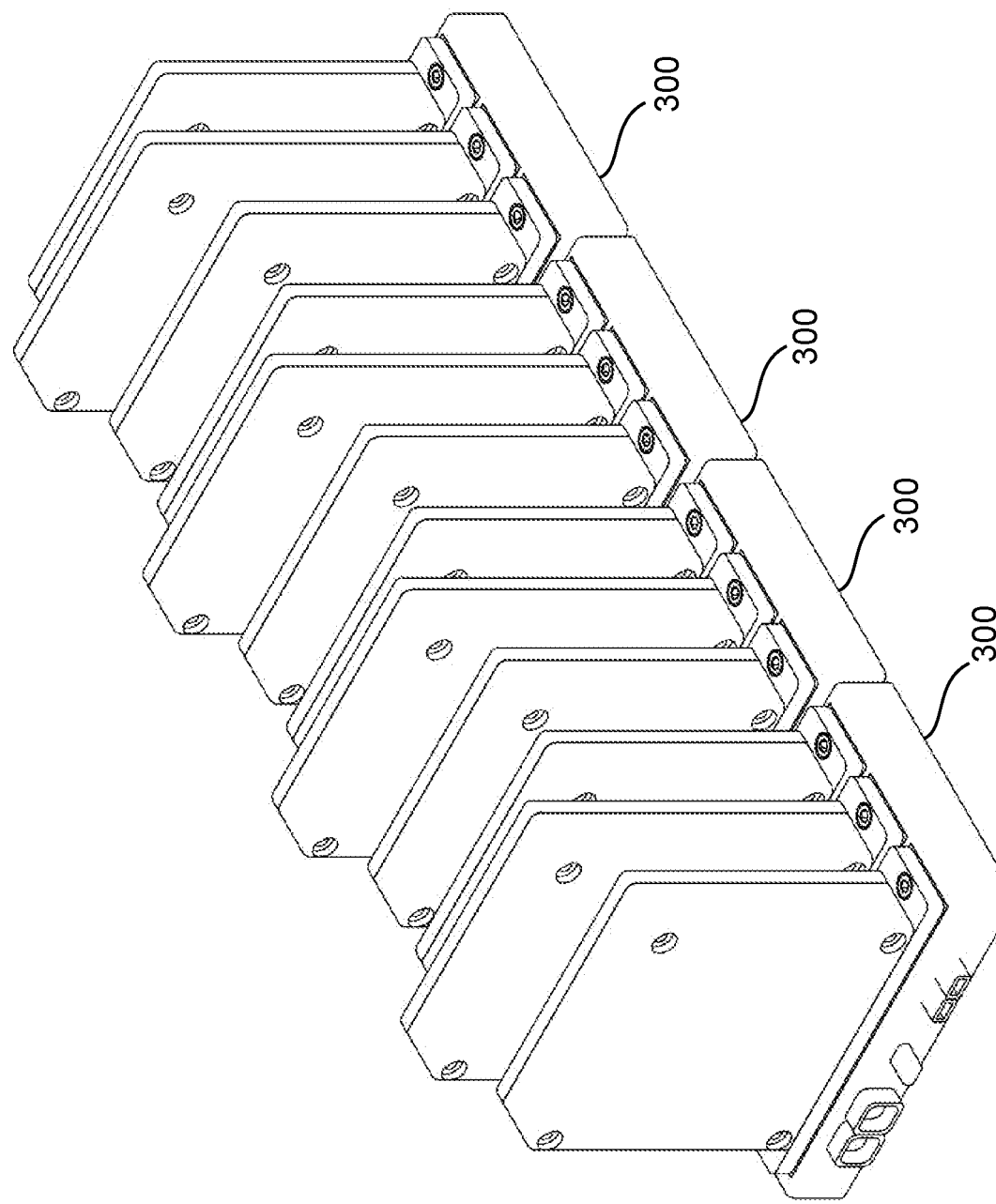
FIG. 3C is an isometric view of four of the modular attachment units of FIG. 3B attached in series.
Figure 3D:
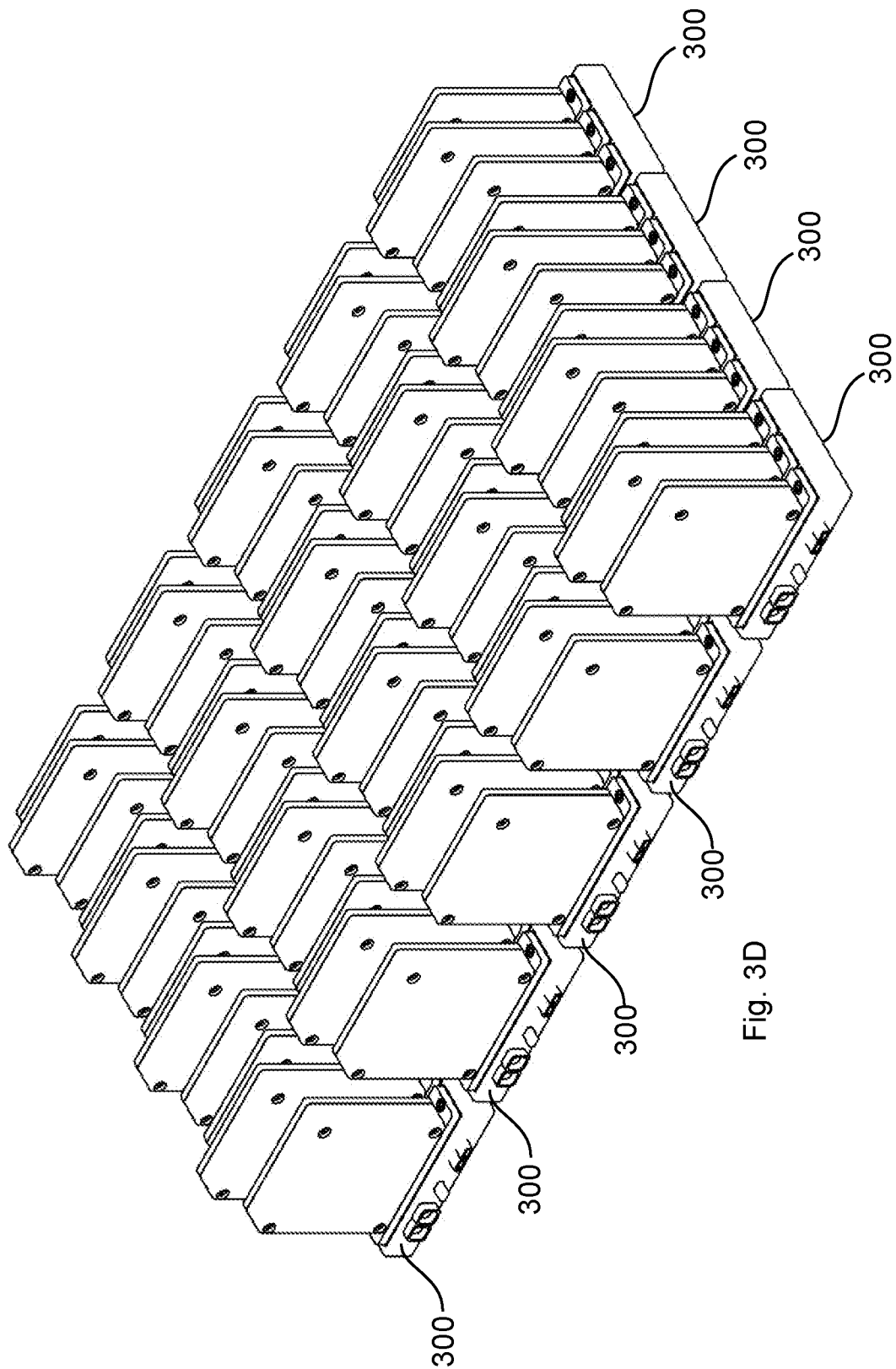
FIG. 3D is an isometric view of five parallel sets of the four modular attachment units of FIG. 3C.

Now referring to FIG. 3, FIG. 3A is an isometric view of a device for converting electric power that may be used in one embodiment of the present invention. FIG. 3B is an isometric view of the modular attachment units of FIG. 3A. FIG. 3C is an isometric view of four sets of the modular attachment units of FIG. 3B attached in series. FIG. 3D is an isometric view of five parallel sets of the four modular attachment units of FIG. 3C. A power bus 302 is connected to a power input 306 and a power output 308. A converter module consisting of a low voltage bridge 304, a transformer 305, and a high voltage bridge 303 are connected on the power bus 302 as modular attachment unit 300. A disconnect 307 is capable of disconnecting power from the power input 306 to the power bus 302, or from the power output 308 and the power bus 302, or from both. A controller module 312 has a data or health indication light 313. In this embodiment, cooling lines can be attached at cooling ports 320 to provide cooling liquid through the entire device. Power passed through input 306 at a low voltage is passed through the power bus to the converter modules 304 and is boosted to a higher voltage and transmitted through the power output 308 to power demand locations. The controller module 312 receives feedback from the converter module and provides instructions to the converter module. In some embodiments, these instructions include varying the converted voltage, varying current transmitted, rerouting the power through a different converter module or converter modules, or combinations thereof. In some embodiments, the feedback includes voltages, currents, frequencies, faults, or combinations thereof. The views of FIGS. 3C and 3D show the systems attached with further sets in series and in series with parallel. In one embodiment, the low voltage bridges are connected in parallel while the high voltage bridges are connected in series.

In one embodiment, the transformer 305 is permanently affixed to the power bus 402, while the bridges 303 and 304 are hot swappable as needed. This is especially beneficial as the transformer 305 is unlikely to have a fault compared to the bridges, enhancing modularity and configurability.

Figure 4:
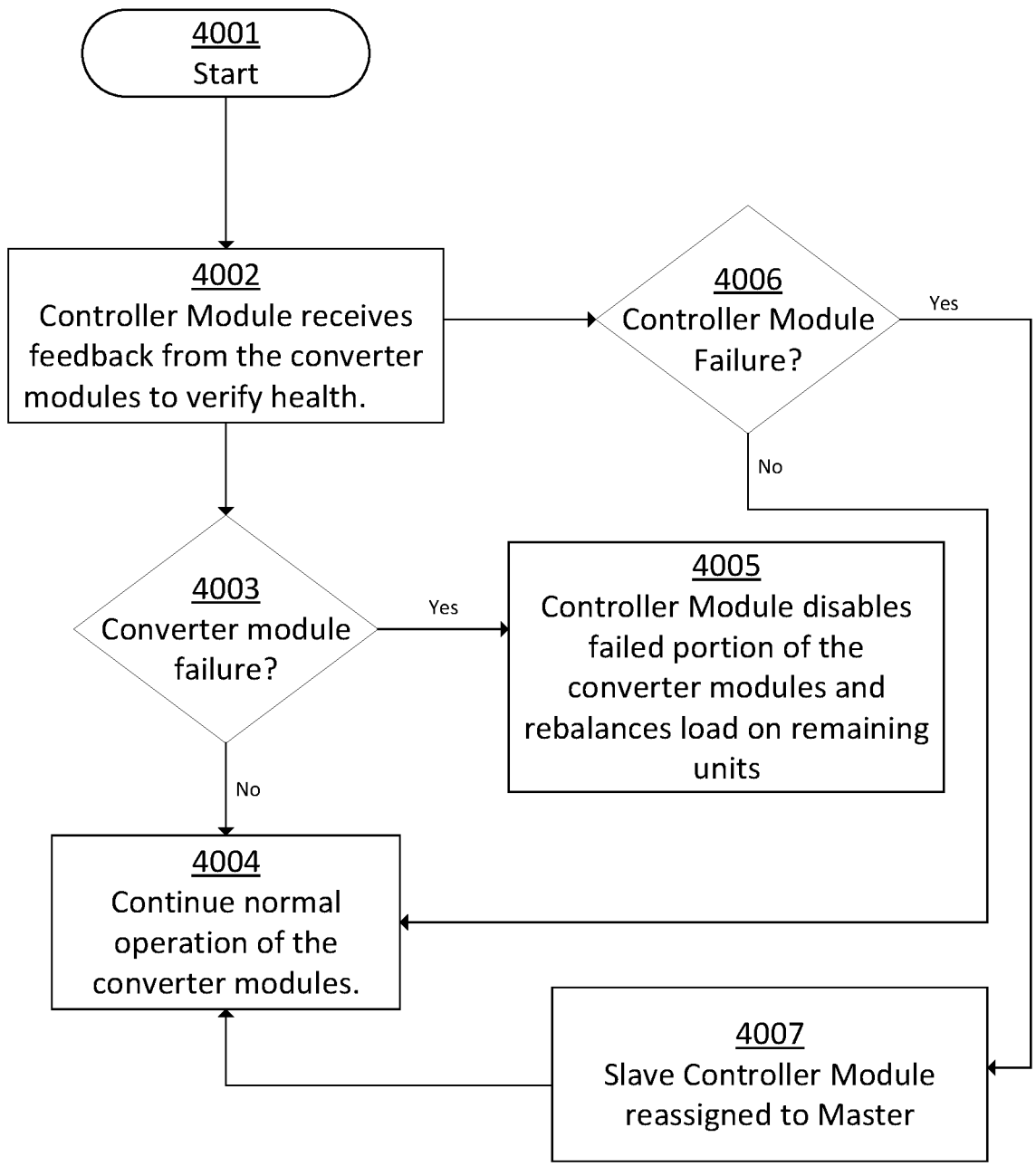
FIG. 4 is a logic diagram showing a method for controlling a method, device, or system for converting electric power.

Now referring to FIG. 4, FIG. 4 is a logic diagram showing a method for controlling a method, device, or system for converting electric power that may be used in one embodiment of the present invention. At 4001, the controller module starts monitoring converter modules, such as those in FIG. 1, 3, 4, or 6. At 4002, the controller module receives feedback from each of the converter modules to verify converter module health. Feedback types are included throughout the other figures. At 4003, the controller module checks for converter module failure for each of the converter modules. If no converter modules are in failure, the controller module proceeds to 4004 and continues normal operation of the converter modules. If an converter module is in failure, the controller module proceeds to 4005 and disables the failed converter module and rebalances the load on the remaining converter modules. At 4006, the controller module itself is checked for failure. If the controller module is operational, the controller module continues to 4004. If the controller module fails, the failure will be detected by a slave controller module and at 4007 the slave controller module will be reassigned to master and continue to 4004 for normal operation of the converter modules. In all cases of failure, operators will be notified and can replace the failed modules physically.

Figure 5:
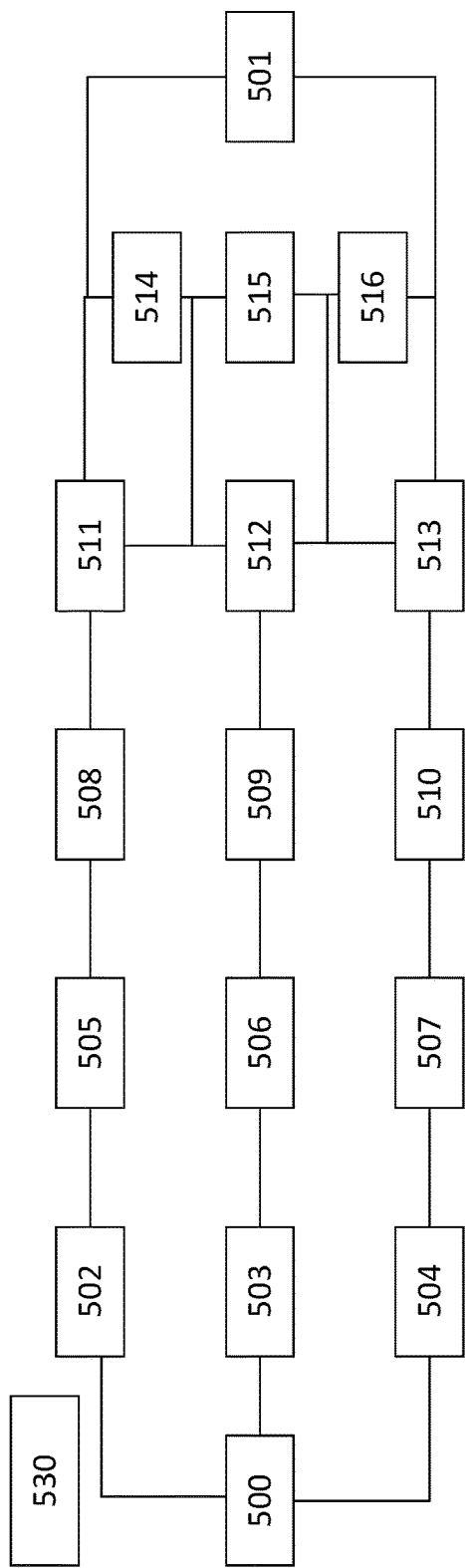
FIG. 5 is a circuit diagram showing a system for converting electric power.

Now referring to FIG. 5, FIG. 5 is a simplified circuit diagram showing a system for converting electric power that may be used in one embodiment of the present invention. This is an exemplary set of embodiments and other voltages and circuit arrangements are possible. While positive and negative terminals are not explicitly shown to simplify the diagram, a person of ordinary skill in the art would understand the appropriate wiring connections from the figure and the description herein. The circuit shown could be used to convert power from 100V to 1 kV and vice versa, or whatever desired voltage boost or buck is desired.

A controller module 530 receives feedback from the converter modules, made up of bridges and transformers from 505 to 513, as will be detailed below. This feedback includes circuit health signals, voltages, currents, frequencies, temperatures, pressures, flows, removal of an converter module, other faults, or combinations thereof. The controller module 530 then sends information back to the converter modules, as described below.

Power is supplied at a power input 500 and bypass mechanisms 502, 503, and 504 allow or prevent power from continuing on their respective circuits. Low voltage bridges 505, 506, and 507 are provided next in their respective circuits in parallel with one another. They are followed by a voltage booster 508, 509, and 510. In some embodiments, these are transformers. After voltage boosting, high voltage bridges 511, 512, and 513 are provided in series. The electrical distribution from these is controlled by bypass mechanisms 514, 515, and 516. The power, now with boosted voltage, passes out power output 501.

The power input 500 has a positive and a negative terminal which are connected with the positive and negative terminals of the low voltage bridges 505, 506, and 507 of the same polarity. The bypass mechanisms 502, 503, and 504 allow the controller 530 to separate the positive or negative terminal connections between the power input 500 and the low voltage bridges 505, 506, and 507. In one mode of operation, the bypass mechanisms 502, 503, and 504 are closed to allow current to flow from the power input 500 to the low voltage bridges 505, 506, and 507. In this mode of operation, the high voltage bridges 511, 512, and 513 are connected in series by connecting the negative voltage terminal of 511 to the positive voltage terminal of 512 and the negative voltage terminal of 512 to the positive voltage terminal of 513. Other modes of operation involving other connections are possible as desired for different voltage/current production plans. In this mode of operation, the bypass mechanisms 514, 515, and 516 are open so that no current flows between them.

In case of failure of low voltage bridge 505, bypass mechanism 502 is opened by the controller 530 so no current can flow to low voltage bridge 505. Concurrently, bypass mechanism 514 is closed, allowing current to bypass high voltage bridge 511. In this way, instead of each of the three circuits providing a third of the voltage conversion, the two remaining circuits each provide half of the voltage conversion.

In case of failure of high voltage bridge 511, the same events are triggered as in the failure of low voltage bridge 505, above.

In both of these failure modes, as the failed bridges are modular, they can be swapped by a maintenance worker, robot, or astronaut. Similar failures of any of the other modules would necessitate similar shutdown of their respective circuits.

In one embodiment, operators remove failed module 502 or 511 and replace it with a new converter module, restoring the system to its previous state. In some embodiments, this swap of modules can be done hot, without shut down and depowering the system, due to a plug and play modality in the converter modules.

In some embodiments, failure happens due to external radiation.

Figure 6:
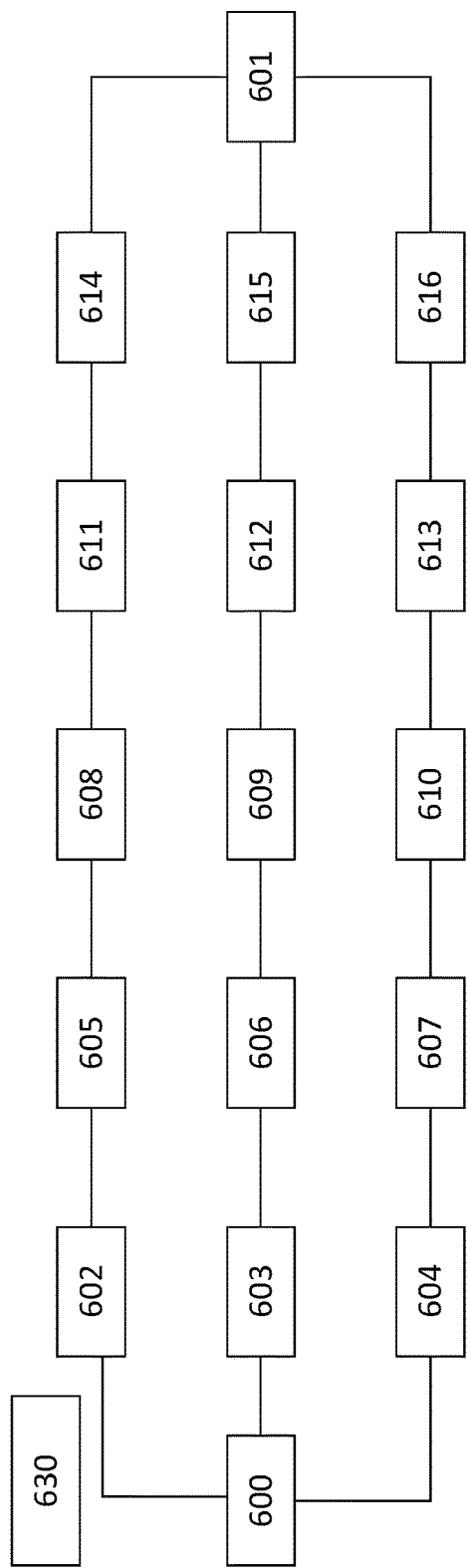
FIG. 6 is a circuit diagram showing a system for converting electric power.

Now referring to FIG. 6, FIG. 6 is a simplified circuit diagram showing a system for converting electric power that may be used in one embodiment of the present invention. This is an exemplary set of embodiments and other voltages and circuit arrangements are possible. While positive and negative terminals are not explicitly shown to simplify the diagram, a person of ordinary skill in the art would understand the appropriate wiring connections from the figure and the description herein. The circuit shown could be used to convert power from 100V to 1 kV and vice versa, or whatever desired voltage boost or buck is desired.

A controller module 630 receives feedback from the converter modules, made up of bridges and transformers from 605 to 613, as will be detailed below. This feedback includes health signals, voltages, currents, frequencies, temperatures, pressures, flows, removal of an converter module, other faults, or combinations thereof. The controller module 630 then sends information back to the converter modules, as described below.

Power is supplied at a power input 600 and bypass mechanisms 602, 603, and 604 allow or prevent power from continuing on their respective circuits. Low voltage bridges 605, 606, and 607 are provided next in their respective circuits in parallel with one another. They are followed by a voltage booster 608, 609, and 610. In some embodiments, these are transformers. After voltage boosting, high voltage bridges 611, 612, and 613 are provided in parallel. The electrical distribution from these is controlled by bypass mechanisms 614, 615, and 616. The power, now with boosted voltage, passes out power output 601.

The power input 600 has a positive and a negative terminal which are connected with the positive and negative terminals of the low voltage bridges 605, 606, and 607 of the same polarity. The bypass mechanisms 602, 603, and 604 allow the controller 630 to separate the positive or negative terminal connections between the power input 600 and the low voltage bridges 605, 606, and 607. In one mode of operation, the bypass mechanisms 602, 603, and 604 are closed to allow current to flow from the power input 600 to the low voltage bridges 605, 606, and 607. In this mode of operation, the high voltage bridges 611, 612, and 613 are connected in parallel. Other modes of operation involving other connections are possible as desired for different voltage/current production plans. In this mode of operation, the bypass mechanisms 614, 615, and 616 are closed so that current flows through them.

In case of failure of low voltage bridge 605, bypass mechanisms 602 and 614 are opened by the controller 630 so no current can flow to low voltage bridge 605 or back to high voltage bridge 611. In this way, instead of each of the three circuits providing a third of the converted current, the two remaining circuits each provide half of the converted current.

In case of failure of high voltage bridge 611, the same events are triggered as in the failure of low voltage bridge 605, above.

In both of these failure modes, as the failed bridges are modular, they can be swapped by a maintenance worker, robot, or astronaut. Similar failures of any of the other modules would necessitate similar shutdown of their respective circuits.

In one embodiment, operators remove failed module 602 or 611 and replace it with a new converter module, restoring the system to its previous state. In some embodiments, this swap of modules can be done hot, without shut down and depowering the system, due to a plug and play modality in the converter modules.

Figure 7:
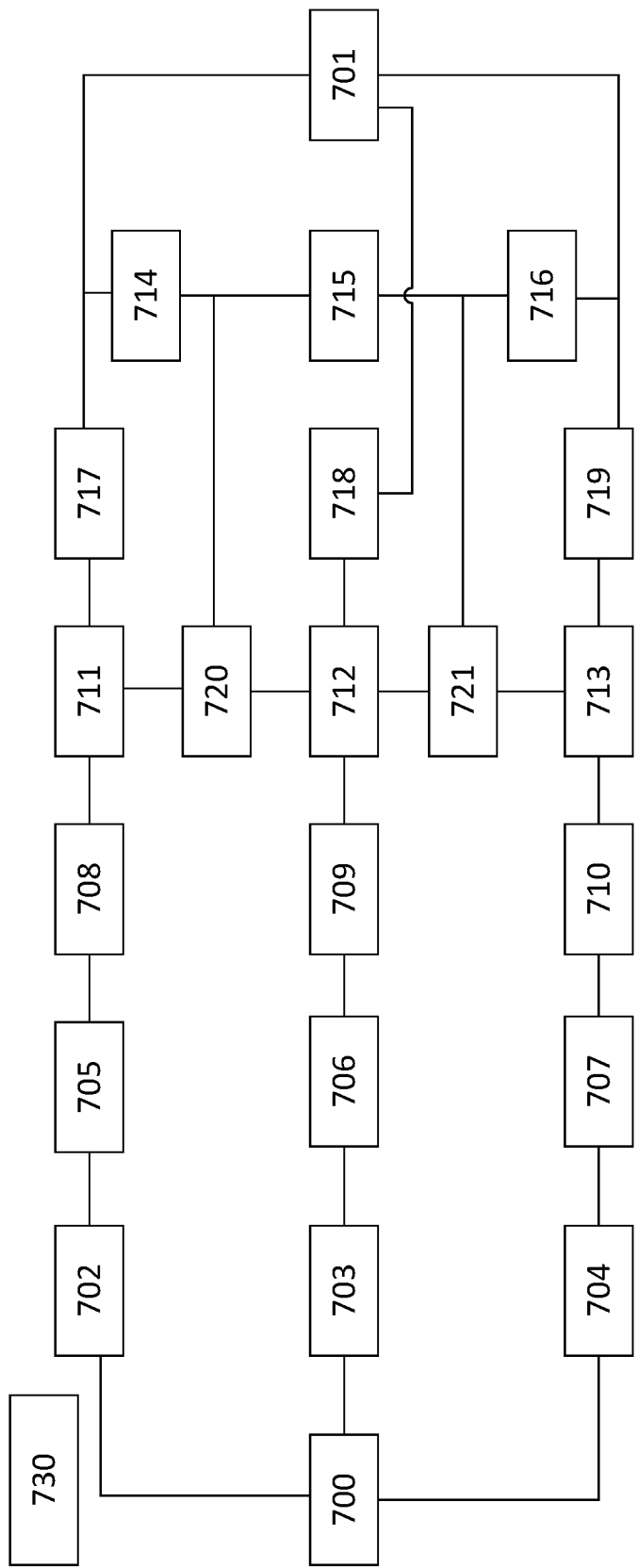
FIG. 7 is a circuit diagram showing a system for converting electric power.

Now referring to FIG. 7, FIG. 7 is a simplified circuit diagram showing a system for converting electric power that may be used in one embodiment of the present invention. This is an exemplary set of embodiments and other voltages and circuit arrangements are possible. While positive and negative terminals are not explicitly shown to simplify the diagram, a person of ordinary skill in the art would understand the appropriate wiring connections from the figure and the description herein. The circuit shown could be used to convert power from 100V to 1 kV and vice versa, or whatever desired voltage boost or buck is desired.

A controller module 730 receives feedback from the converter modules, made up of bridges and transformers from 705 to 713, as will be detailed below. This feedback includes health signals, voltages, currents, frequencies, temperatures, pressures, flows, removal of an converter module, other faults, or combinations thereof. The controller module 730 then sends information back to the converter modules, as described below.

Power is supplied at a power input 700 and bypass mechanisms 702, 703, and 704 allow or prevent power from continuing on their respective circuits. Low voltage bridges 705, 706, and 707 are provided next in their respective circuits in parallel with one another. They are followed by a voltage booster 708, 709, and 710. In some embodiments, these are transformers. After voltage boosting, high voltage bridges 711, 712, and 713 are provided in parallel or series, dependent on the state of bypass mechanisms 714, 715, 716, 717, 718, 719, 720, and 721. The power, now with boosted voltage, passes out power output 701.

The power input 700 has a positive and a negative terminal which are connected with the positive and negative terminals of the low voltage bridges 705, 706, and 707 of the same polarity. The bypass mechanisms 702, 703, and 704 allow the controller 730 to separate the positive or negative terminal connections between the power input 700 and the low voltage bridges 705, 706, and 707. In one mode of operation, the bypass mechanisms 702, 703, and 704 are closed to allow current to flow from the power input 700 to the low voltage bridges 705, 706, and 707.

In a series mode of operation for the high voltage bridges 711, 712, and 713, the negative voltage terminal of 711 to the positive voltage terminal of 712 and the negative voltage terminal of 712 to the negative voltage terminal of 713 by having bypass mechanisms 717, 719, 720 and 721 direct power accordingly.

In this in series mode of operation the bypass mechanism 714, 715, and 716 are open not allowing current to flow through.

In a parallel mode of operation the bypass mechanism 717, 718 and 719 are closed allowing current to flow from the high voltage bridge 711, 712 and 713 to the power output 701.

In this parallel mode of operation the bypass mechanism 714, 715, 716, 720, 721, and 716 are open not allowing current to flow through.

In case of failure of any of the low or high voltage bridges the bypass mechanisms 702, 703, 704, 714, 715, 716, 717, 718, 719, 720 and 721 are directing the current in a logical manner as described for the circuit arrangements in FIG. 6 and FIG. 7.

In case of a failure, as the failed bridges are modular, they can be swapped by a maintenance worker, robot, or astronaut.

In one embodiment, operators remove failed module 702 or 711 and replace it with a new converter module, restoring the system to its previous state. In some embodiments, this swap of modules can be done hot, without shut down and depowering the system, due to a plug and play modality in the converter modules.

Figure 8A:
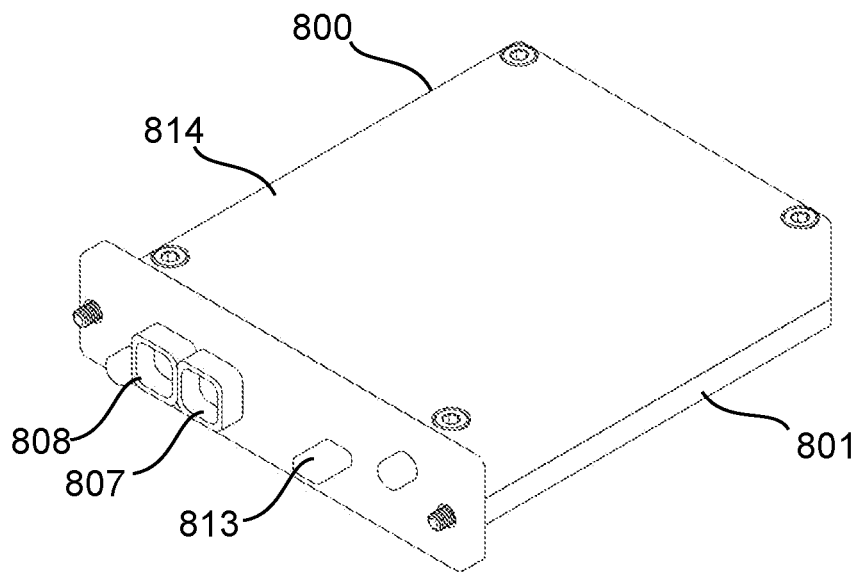
FIG. 8A is an isometric drawing showing an converter module with a cover.
Figure 8B:
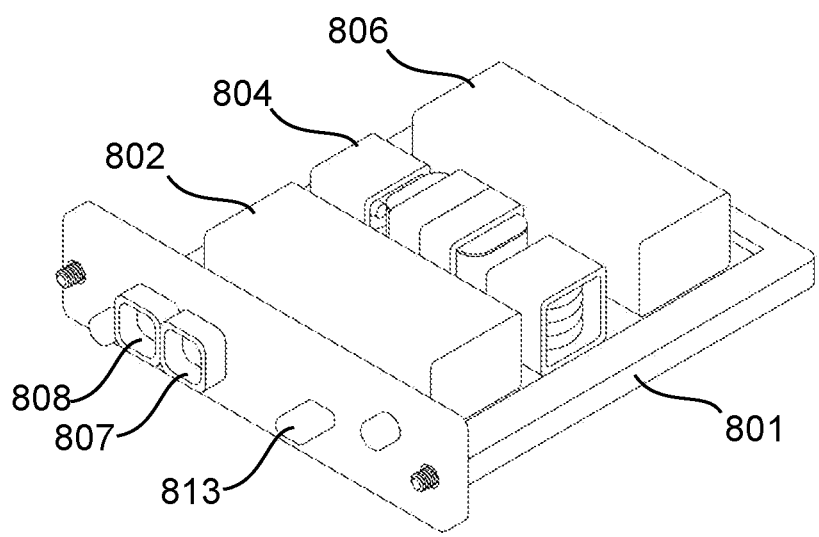
FIG. 8B is an isometric drawing showing the converter module of FIG. 7A without the cover.

Now referring to FIG. 8, FIG. 8A is an isometric drawing showing an converter module with a cover that may be used in one embodiment of the present invention. FIG. 8B is an isometric drawing showing the converter module of FIG. 8A without the cover. A base 801 and cover 814 enclose a low voltage bridge 802 connected to a transformer 804, which connects to a high voltage bridge 806. Power enters at 807 and leaves at 808. The low voltage bridge 802 receives power at a low voltage, passes it through the transformer 804, and produces a higher voltage at high voltage bridge 806, which is sent on as a power output on the power bus. Data connection 813 connects to a controller, as in other embodiments.

In some embodiments, the converter modules consist of a low voltage bridge, a voltage converter, and a high voltage bridge. The voltage converter may be an LLC.

In some embodiments, the instrumentation components are selected from a group consisting of health monitors, flow control valves, thermocouples, pressure sensors, current sensors, voltage sensors, power sensors, frequency sensors, and combinations thereof.

In some embodiments, more than one set of MCEPC units, each containing their own sets of converter modules, are connected in series, parallel, or both, to provide power to outside users at a variety of intermediate voltages.

In some embodiments, the controller module receives notice of a failure from the converter modules and illuminates an LED light or triggers an alarm in the Human Machine Interface that alerts the operators of the converter module failure.

The invention has been described with reference to various specific and preferred embodiments and techniques. Nevertheless, it is understood that many variations and modifications may be made while remaining within the spirit and scope of the invention.

What is claimed is:

1. A system to convert electric power comprising:
   one or more converter modules configured to bidirectionally convert voltage from a power input and transmit converted voltage to a power output;
   a power bus configured to connect the power input, the one or more converter modules, and the power output;
   a controller module configured to receive feedback comprising voltages, currents, frequencies, faults, or combinations thereof from the one or more converter modules; and the controller module further configured to provide instructions to the one or more converter modules to reroute power bidirectionally through a different converter module or converter modules of the one or more converter modules.

2. The invention of claim 1, wherein the one or more converter modules comprise a low voltage bridge, a voltage converter, a high voltage bridge, and combinations thereof.

3. The invention of claim 2, wherein the one or more converter modules are connected such that the low voltages bridges are connected in parallel and the high voltage bridges are connected in series, in parallel, or combinations thereof.

4. The invention of claim 1, wherein the power input is configured to connect to the power bus through a filter, a disconnect, or a filter and a disconnect, and the power bus is configured to connect to the power output through a filter, a disconnect, or a filter and a disconnect.

5. The invention of claim 1, wherein the one or more converter modules are further configured to be hot swappable on and off the power bus.

6. The invention of claim 1, wherein the controller module uses a communication bus configured to receive and pass the feedback and to receive and provide the instructions.

7. The invention of claim, wherein auxiliary circuits and instrumentation components are configured to communicate with the controller module through the communication bus.

8. The invention of claim 7, wherein the instrumentation components are selected from a group consisting of health monitors, flow control valves, thermocouples, pressure sensors, current sensors, voltage sensors, power sensors, frequency sensors, and combinations thereof.

9. A method for converting electric power comprising:
bidirectionally converting voltage by providing power to a power input and through one or more converter modules;
transmitting converted voltage from the one or more converter modules to a power output;
sending feedback from the one or more converter modules to a controller module, feedback comprising voltages, currents, frequencies, faults, or combinations thereof; and
providing instructions to the one or more converter module to reroute the power bidirectionally through a different converter module or converter modules of the one or more converter modules.

10. The invention of claim 9, wherein the one or more converter modules consist of a low voltage bridge, a voltage converter, a high voltage bridge, and combinations thereof.

11. The invention of claim 10, wherein the one or more converter modules are connected such that the low voltages bridges are connected in parallel and the high voltage bridges are connected in series, in parallel, or combinations thereof.

12. The invention of claim 9, further comprising passing power wherein the power input connects to the power bus through a filter, a disconnect, or a filter and a disconnect, and the power bus connects to the power output through a filter, a disconnect, or a filter and a disconnect.

13. The invention of claim 9, wherein the feedback and the instructions are transmitted via a communication bus.

14. The invention of claim 13, further comprising transmitting data between the controller module, auxiliary circuits, and instrumentation components via the communication bus.

15. The invention of claim 14, wherein the instrumentation components are selected from a group consisting of health monitors, flow control valves, thermocouples, pressure sensors, current sensors, voltage sensors, power sensors, frequency sensors, and combinations thereof.

16. A device for converting electric power comprising:
a power bus connected to a power input, a power output, and one or more converter modules;
a controller module;
wherein power is passed through the power input to the power bus and to the one or more converter modules, and wherein the one or more converter modules bidirectionally convert voltage and supply converted voltage to the power output;
wherein the controller module receives feedback from the one or more converter modules and provides instructions to the one or more converter modules to reroute the power bidirectionally through a different converter module or converter modules of the one or more converter modules; and
wherein the feedback comprises voltages, currents, frequencies, faults, or combinations thereof.

17. The invention of claim 16, wherein the one or more converter modules consist of a low voltage bridge, a voltage converter, a high voltage bridge, and combinations thereof.

18. The invention of claim 17, wherein the one or more converter modules are connected such that the low voltages bridges are connected in parallel and the high voltage bridges are connected in series, in parallel, or combinations thereof.

19. The invention of claim 16, wherein the power bus has built in voltage converters.

20. The invention of claim 16, further comprising a communication bus on which the controller, auxiliary circuits, and instrumentation components are attached, and wherein the controller module, the auxiliary circuits, and the instrumentation components communicate through the communication bus.

* * * * *